(12) United States Patent
Coley

(10) Patent No.: US 7,225,090 B2
(45) Date of Patent: May 29, 2007

(54) METHOD FOR MEASURING CAPACITANCE AND EQUIVALENT PARALLEL RESISTANCE

(75) Inventor: William H. Coley, Longmont, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/261,699

(22) Filed: Oct. 28, 2005

(65) Prior Publication Data

US 2007/0100566 A1   May 3, 2007

(51) Int. Cl.
  *G01R 25/00* (2006.01)
(52) U.S. Cl. ............................................. 702/65
(58) Field of Classification Search .............. 702/65
  See application file for complete search history.

(56) References Cited

U.S. PATENT DOCUMENTS 5,838,294 A * 11/1998 Praiswater .................. 345/102

2002/0118051 A1 * 8/2002 Suzuki et al. ............... 327/129

* cited by examiner

*Primary Examiner*—John Barlow
*Assistant Examiner*—Demetrius Pretlow
(74) *Attorney, Agent, or Firm*—Edward L. Miller

(57) ABSTRACT

$C_X$ is measured in the presence of $R_P$ by charging $C_X$ with a constant current $I_C$ for a period time and taking four (time, voltage) pairs: $(t_A, V_A)$, $(t_B, V_B)$, $(t_C, V_C)$ and $(t_D, V_D)$. The first pair are sufficiently close together that the short straight line segment connecting $(t_A, V_A)$ and $(t_B, V_B)$ is not significantly different from the corresponding segment of a true graph of the capacitor's actual charging. A similar requirement is imposed on the time interval between $t_C$ and $t_D$. The time interval $t_A t_B$ need not be the same as $t_C t_D$. The interval $t_B t_C$ should be long enough that if there is significant $R_P$ present then there is at least a discernable difference between the true graph and a straight line between the first pair and the second. $C_X$ and $R_P$ are computed as a function of the four pairs and $I_C$, and $C_X$ may then be diminished by a previously measured value for a stray capacitance present in the absence of $C_X$.

9 Claims, 3 Drawing Sheets

METHOD FOR MEASURING CAPACITANCE AND EQUIVALENT PARALLEL RESISTANCE

BACKGROUND OF THE INVENTION

There are numerous prior art techniques for measuring capacitance. Since it turns out that a capacitor is often better thought of as a machine or complex mechanism in its own right, rather than as an ideal basic property, the best way to measure a particular capacitor is with a technique that operates the capacitor in an environment similar to its expected use in practice. As an example, when the capacitor is to be used at RF (Radio Frequencies), and particularly at the higher ones above VHF (Very High Frequencies), e.g., at UHF (Ultra High Frequencies) or at microwave frequencies, (these days, generally 1 GHz and up), a genuine RF measurement technique (e.g., a suitable bridge) may be required, owing the unpredictable way that other reactance and losses peculiar to RF manifest themselves. For applications of capacitors at audio frequencies and at DC, measurements can often be performed with just DC techniques, although there are types of capacitor test equipment that do perform dedicated audio measurements.

These days, the degree of functionality that can be provided in what used to be called a VOM (Volt Ohm Milliammeter), or perhaps a VTVM (Vacuum Tube VoltMeter), and is finally at present a DVM (Digital VoltMeter) and its sibling the DMM (Digital Multi-Meter) means that these newer instances of electronic test equipment usually do much more than their ancestors the VOM and VTVM. In no small measure this because the best ADC (Analog to Digital Conversion) techniques are very algorithmic in nature, with the outcome that these DVMs and DMMs use a mix of processing power assisted by dedicated hardware to achieve their aims. Given that such is the case, much of the added functionality mentioned above can be provided by merely adding further algorithmic content supported with little or no extra hardware. Often the only 'extra' hardware is what is needed to provide a pleasant user interface, since DVMs and DMMs are not yet expected to have anything like the GUI (Graphical User Interface) that assumes the presence of the monitor, keyboard and mouse that are so familiar to today's computer users.

Furthermore, modern ADC techniques more often than not employ timing resources of modest to good capability, so that even if they are not a replacement for a good general purpose counter, many of the additional features that a DVM or DMM might have are based on an independent ability to measure the times related to when things happen, and to do things at specific times. So, the notion that the value of a capacitance can be discovered by charging it with a constant current (say, one otherwise used for the ohmmeter function) and either measuring how long it takes to reach a certain voltage, or, charging it for a certain known time and then measuring the resulting voltage, (both of which exploit the relationship I=C(dv/dt)) is a good example of the kind of auxiliary functionality that is often found in such test equipment of today. It will be noted that this class of added feature for a DC digital meter arises from the confluence of the ability to measure time, voltage, set a constant current, and perform arithmetic computation.

Just as the RF community appreciates certain capacitor properties that can only be measured under RF conditions, today's fast DVMs and DMMs can provide a variety of useful low frequency and 'static' parameters about the capacitances they measure. But not all measurement techniques measure all such parameters; some techniques ignore this one, while others ignore or cannot measure another. For example, the simple constant current method mentioned just above does not, without elaborate precautions, or requiring computational resources in excess of the benefit obtained by the result, account for an equivalent parallel resistance ($R_P$) within the specimen whose capacitance $C_X$ is being measured. Not only is $R_P$ not reported, but its presence can cause the measured capacitance $C_X$ to be in error.

The reason for this is as follows. One would ordinarily expect a capacitance charged with a constant current source to exhibit a liner change in voltage (a ramp). It will, if it is an ideal capacitor and the current is truly constant. $R_P$ is one of a capacitor's potential warts that will cause the charging curve to assume an exponential form. It is not difficult to appreciate the underlying difficulty. As the voltage across the capacitor rises, ever more current flows through $R_P$, since there is more voltage across it. But the total current flow for both the capacitor and $R_P$ is just that provided by the constant current source. That current is now divided, and ever less of the total goes to the capacitor as its voltage increases. Thus, the capacitor is NOT being charged with a constant current, after all! The decreasing amount of current entering the capacitor means that the voltage across the capacitor is rising ever more slowly. Instead of a ramp there will be an exponential curve influenced by the value of $R_P$. In principle, one can find from measurement what the particular equation is that describes the particular observed behavior, and then solve it for $C_X$ and $R_P$. The reality is that it is an ugly process, requiring a considerable amount of computational horsepower—much more than a mere DMM would ordinarily command. So much for the straightforward brute force approach!

As designers and purveyors of fine quality test equipment, we should like have an algorithmic technique that is based on the constant current trick for charging a capacitor to measure its capacity, but we should also like to be able to measure $R_P$ and report correct values for both $C_X$ and $R_P$ that are commensurate with the resolution that our DMM exhibits for other measurements that it can make. Such a capability should be fast, so that averages for repeated measurements can extend resolution and are readily available without a perceived penalty of undue delay, and should lend itself to easy auto-ranging over many decades. And it in keeping with that, as well as with a desire for economy, the algorithmic aspect of such a technique should not be a resource hog; it would be most desirable if it returned accurate answers with just the use of the four basic arithmetic operations of addition, subtraction, multiplication and division. That is a significant wish list. What to do?

SUMMARY OF THE INVENTION

A method for measuring $C_X$ and $R_P$ is to charge the capacitor with a known constant current for a period time, during which four (time, voltage) pairs are taken. The four voltages are $V_A$, $V_B$, $V_C$ and $V_D$, while we shall call the respectively associated four times $t_A$, $t_B$, $t_C$ and $t_D$. The first pair of measurements are taken sufficiently close together that the short straight line segment connecting $P_1=(t_A, V_A)$ and $P_2=(t_B, V_B)$ is not significantly different from the corresponding segment of a true graph of the capacitor's actual charging, were it to be discovered. A similar requirement is imposed on the time interval between $t_C$ and $t_D$ for points $P_3=(t_C, V_C)$ and $P_4=(t_D, V_D)$ and their interconnecting line segment. The time interval $P_1P_2$ need not be the same as $P_3P_4$. The interval $P_2P_3$ should be long enough that if there is a significant amount of $R_P$, then the difference between the straight line segment from $P_2$ to $P_3$ and the true graph is readily discernable. On the other hand, preserving measurement speed and possibly limiting the voltage rise on the capacitor are considerations that restrain the urge to indefinitely increase the time interval from $P_2$ to $P_3$. Furthermore, there are properties of capacitors, such as DA (Dielectric Absorption) and ESR (Equivalent Series Resistance) that are apt to appear more pronounced at higher measurement voltages, and their effects, when present, contaminate the measurement. Accordingly, we prefer to limit the time interval $P_2P_3$ (and by extension, $P_1P_4$) to one where the current source in use does not produce voltages that are sufficiently large that the effects of DA or ESR become worrisome.

Once the eight measured parameters are in hand, the sought after values for $C_X$ and $R_P$ are closely approximated by evaluating one of the following relationships:

$$C_X \cong I_C \frac{V_2 - V_1}{\left(\frac{dv}{dt}\right)_1 V_2 - \left(\frac{dv}{dt}\right)_2 V_1} - C_{\text{offset}} \quad (1)$$

$$C_X \cong \frac{I_C \Delta t}{2} \left( \frac{V_D + V_C - V_B - V_A}{V_B V_C - V_A V_D} \right) - C_{\text{offset}} \quad (2)$$

$$R_P \cong \frac{1}{C_X} \cdot \frac{V_2 - V_1}{\left(\frac{dv}{dt}\right)_1 - \left(\frac{dv}{dt}\right)_2} \quad (3)$$

The value $C_{\text{offset}}$ in equations (1) and (2) is a constant that describes the stray capacitance inherent in the measurement setup. It is found by the simple expedient of physically removing $C_X$ from the test setup and performing the measurement, anyway. $C_{\text{offset}}$ may be stored and then retained until a change in the nature of the measurement setup is made, and new value is needed. It is useful to note that $C_{\text{offset}}$ has its own version of $R_P$, and that finding $C_{\text{offset}}$ as described takes that into account, so that its effects do not co-mingle with the $R_P$ of $C_X$. The value $\Delta t$ in equation (2) is the time interval for $P_1P_2$ (and also $P_3P_4$).

After a measurement as described, the constant current source can be set to discharge the capacitor, whereupon the charging begins again, with another set of measurements ($P_1$–$P_4$) that need not necessarily have the same values for $t_A$, $t_B$, $t_C$ and $t_D$. Of course, we are wise to be reasonably careful and consistent in the way the time axis is interpreted—say, as a coordinate system with one long time axis with $t_0$ far to the left and ahead of the start of any activity, or, as a series of independently repeated measurements, each of which has its own $t_0$ at an origin of a coordinate system for each measurement cycle. The difference is largely one of implementation, most probably in a layer outside the application of the central formula. The points $P_1$–$P_4$ need not be restricted to ones that have just one polarity of voltage; the voltage could always be of the same polarity, or it might change from one measurement cycle to the next, or even within a given measurement cycle. Consecutively obtained values for $C_X$ may be averaged for a more accurate result. The formula shown above can be adapted to measure $C_X$ during discharge as well, if desired. (Provided, of course that the discharge is through a constant current source. If it is through a simple resistor, then that discharge will not support a measurement cycle.)

DESCRIPTION OF A PREFERRED EMBODIMENT

Figure 1:
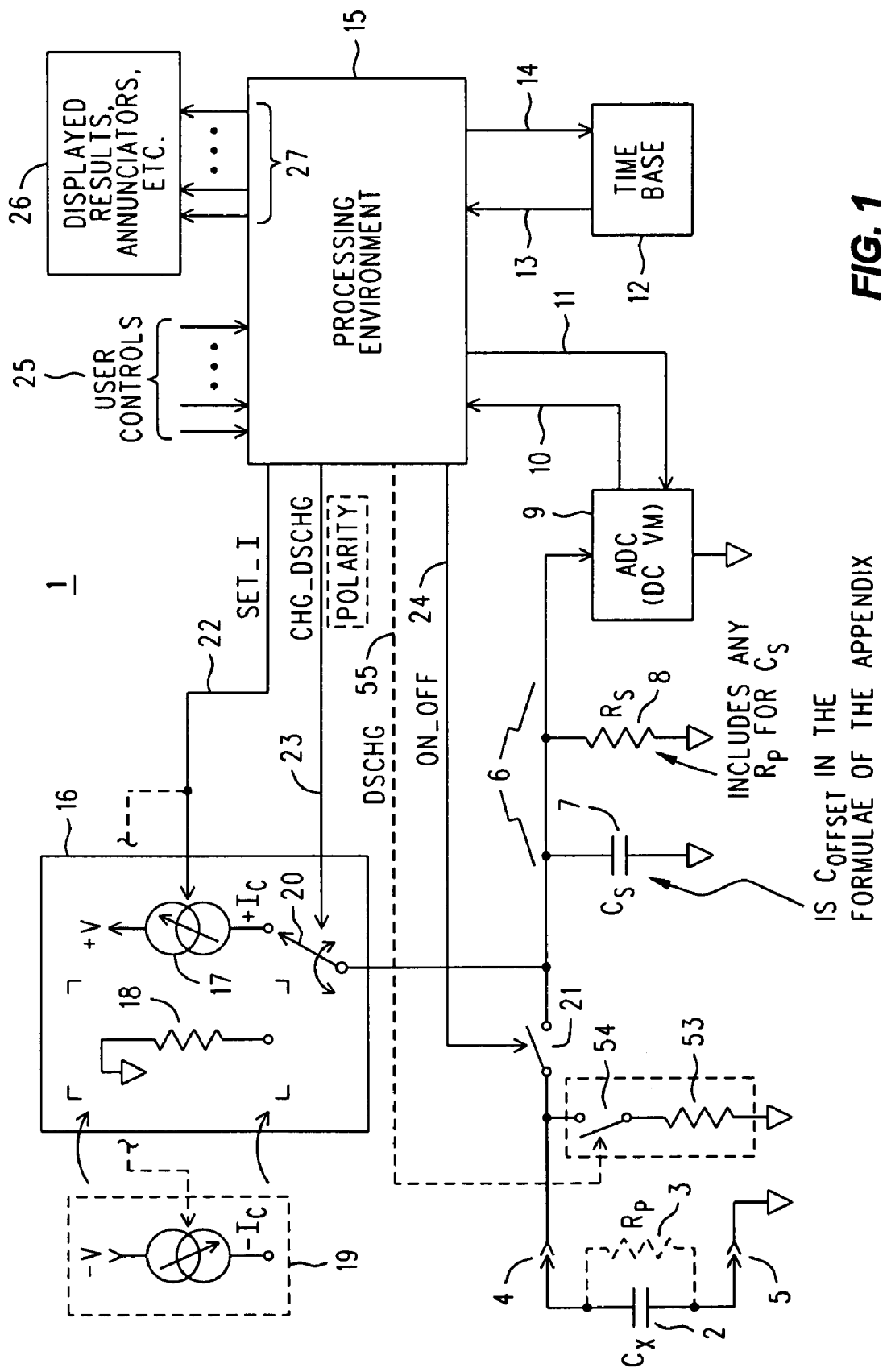
FIG. 1 is a simplified generalized block diagram of a hardware architecture that may employed in conjunction with capacitance measurements performed in accordance with the principles of the invention.

Refer now to FIG. 1, wherein is shown a simplified hardware block diagram 1 for making measurements of capacitors with a constant current source, an accurate DC voltmeter, timing resources and programmed computational resources. To that end, a work capacitor 2 whose value $C_X$ and parallel resistance $R_P$ 3 are to be measured is attached to measurement terminals 4 and 5. Terminal 5 may be at ground, while terminal 4 is driven through a switch 21 by a controllable Constant Current Source 16 which is also connected via parallel connection 6 to an ADC 9. ADC or DC Volt Meter 9 may also be the principle measuring mechanism in a DVM or DMM of which the hardware block diagram 1 is a part. (If such were the case, and there are products where it is, such as the Agilent 34401A, then it is probable that there is more stuff in the comparable block diagram for that product than is shown in FIG. 1, which is fair because of the extra functions found in such a product and which we not interested in here. It will be appreciated that even though the Agilent 34401A has such a hardware compliment, it does not measure $C_X$ nor does it measure $R_P$.)

Despite our best efforts, other equivalent components are part of connection 6. These are a small capacitance $C_S$ 7 (the S is for Shunt, or perhaps Stray) and a relatively large resistance $R_S$ 8 (ditto for the S). For many purposes these can be safely ignored, but for measurements made on behalf of certain applications (matching, precision ratios, etc.) they may be significant and the person performing the measurement may want to know what they are, so that their effects can be removed from the measurement of the work capacitor 2 to find its $C_X$ and $R_P$. $C_S$ 8 may arise from the existence and routing of wires, as well as from input capacitance of the ADC 9 and capacitance in the Constant Current Source 16. $R_S$ may arise from leakage resistance to ground for conductor 6 and anything else connected to it, as well as from the input resistance of the ADC 9.

It is not hard to appreciate the need to discover the value of $C_S$: it is clearly in parallel with $C_X$, and the parallel combination of the two will be what is obtained when attempting to measure $C_X$. Once the value $C_S$ is known, however, it can readily be subtracted from the measured value of $C_X$ to reveal the actual value of $C_X$. Cs is found by the simple expedient of causing switch 21 to open, and then performing a measurement cycle as if to find (the now absent, or disconnected) work capacitor 2. The value for $C_S$ may be stored and subsequently retained for as long as seems useful.

Compensating the measurement for the effects of $R_P$ 3 and $R_S$ 8 is not as simple. It will be remembered and also appreciated that we are interested in accurate measurements, despite their presence. It is also evident that the hardware block diagram 1 does not in and of itself facilitate the discovery of their values and the removal of an exponential component they add to the voltage ramp produced by the Constant Current Source 16 on the parallel combination of the work capacitor 2 and $C_S$ 7 (recall the discussion in the Background Of The Invention).

To continue, a Processing Environment 15, which may include, but is not limited to, processors, FPGAs (Field Programmable Gate Arrays that often substitute for small processors) ALUs (Arithmetic Logic Units) ROM (Read Only Memory), RAM (Random Access Memory that is readable and writable), Registers, Interfaces for peripheral devices, Bus Controllers, and perhaps even a mass storage device. In the case where the block diagram 1 is for a DMM, DVM or a dedicated capacitor tester that does little else, the Processing Environment 15 would be part of a self-contained unit. That is, comprised of internal components under the unit's covers, just as is a power supply and any other needed stuff, including various user controls 25 and a Display 26 driven by control lines 27 for presentation of displayed results, various annunciators and mode indicators, etc.

The Processing Environment executes programmed instructions that form measurement cycles from the resources within the block diagram 1 and compute results from parameter values measured as parts of those measurement cycles. In that connection, the times at which voltages are measured are themselves parameters of interest that are used in the control of the voltage measurements and also in the computations. To that end a Time Base 12 is controlled by the Processing Environment 15 through a mechanism represented by line 14. Times are communicated to the Processing Environment over a mechanism represented by line 13. There may be instances where line 14 is absent and line 13 amounts to a simple stable system clock signal and time keeping along a time axis and an 'alarm clock function' ("interrupt me in ten milliseconds so that I can go do . . . ") are functions contained within the Processing Environment itself.

It will be appreciated that the Processing Environment 16, together with the user controls 25 and Display 26, might be a separate computer connected via an interface to the balance of the block diagram 1. In that case the Time Base 12 might be a separate Time Base as shown, or one that is internal to the computer in essentially the same way we said above that it might be part of a genuine on-board Processing Environment. These days, the separate computer trick is conventional, and we don't show it as it can be done in a variety of ways that are not of interest here, and that in any event are well understood. Our principle interest below will be in how the Processing Environment 15 forms and controls the measurement cycles and in the nature of the computations that it performs on the measurements taken.

In connection with such control, the ADC 9 can be told to take a (brief) voltage measurement through a control mechanism that is represented by line 11. In the scheme of things as we show them in FIG. 1, the ADC 9 may do the requested measurement immediately (we assume good algorithmic housekeeping prevents issuing an impolite command to perform a second measurement while a first one is still in progress . . . ). The results are reported to the Processing Environment 15 with a mechanism represented by line 10.

In further connection with such control, and of particular interest since it is how the work capacitor 2 is exercised to reveal its properties, is the controllable Constant Current Source 16 and the way it may be operated by control mechanisms originating with the Processing Environment.

These mechanisms include one called SET_I 22, one called CHG_DISCHG 23, and one called ON_OFF 24 that is used to connect or disconnect the work capacitor 2 with switch 21.

The Constant Current Source includes an adjustable regulated (DC) current generator 17 that is responsive to SET_I 22 by adjusting its regulated amount to be a desired $I_C$. The current generator is coupled to a suitable power supply, which is this case is shown to be a positive one (+V). The polarity of the supply is a matter of choice.

When switch 21 is closed, $I_C$ will charge the work capacitance 2 provided switch 20 is set to connect the current generator 17 to switch 21. Switch 20 is controlled by CHG_DISCHG 23. The idea here is that while the path just described will indeed get a charge and an associated voltage ramp to occur on the work capacitor 2, we nevertheless need, after some related time has passed, to get that charge off the work capacitor so we can do it all over again. That is, the work capacitor has to be discharged before it can be re-charged. We should like to perform repeated measurement cycles, so as to be able to average the results for increased accuracy. Also, even if were only going to make a single (first) measurement cycle on an arbitrary work capacitor, it would behoove use to make the sure that the thing is not already charged before we start . . . . To that end we need to be set switch 20 to something other than some path connected to +V. Ground is a good choice, and connecting to ground through a resistor 18 is an even better one. That is exactly what is shown within the confines of the controllable Constant Current Source 16.

A "more deluxe" arrangement is shown by the dotted line 19. It includes another instance of an adjustable regulated (DC) current generator (19) that can replace resistor 18, and when present will also be controlled by SET_I 22. In this case, however, adjustable regulated current generator 19 is coupled to a power supply −V that is of polarity opposite that of the power supply (+V) for generator 17. In the event generator 19 replaces resistor 18, we say that line 23 is called POLARITY instead of CHG_DISCHG. That is because if the V in +V is the same as the V in −V, (and that equality will generally be convenient) then switching from $+I_C$ to $-I_C$ is not simply charging and discharging unless some elaborate steps are taken to arrange it. Instead, it is more convenient to simply say that we are charging the work capacitor one way, and then charging it the other way, and that if it IS ever discharged, then it is just for the instant when the voltage ramp on the capacitor passes through zero volts.

An even more deluxe arrangement is to re-locate resistor 18 to alternate location 53 through additional switch 54 that may be operated by a control mechanism DISCHG represented by dotted line 55, such that switches 21 and 54 are never closed at the same time. That way we could always provide a safe way to discharge any work capacitor of unknown condition upon its initial connection to the terminals 4 and 5, as well as get it safely discharged whenever measurement cycles are not in progress (and the operator is intending to remove the work capacitor 2 from the terminals 4 and 5).

Figure 2:
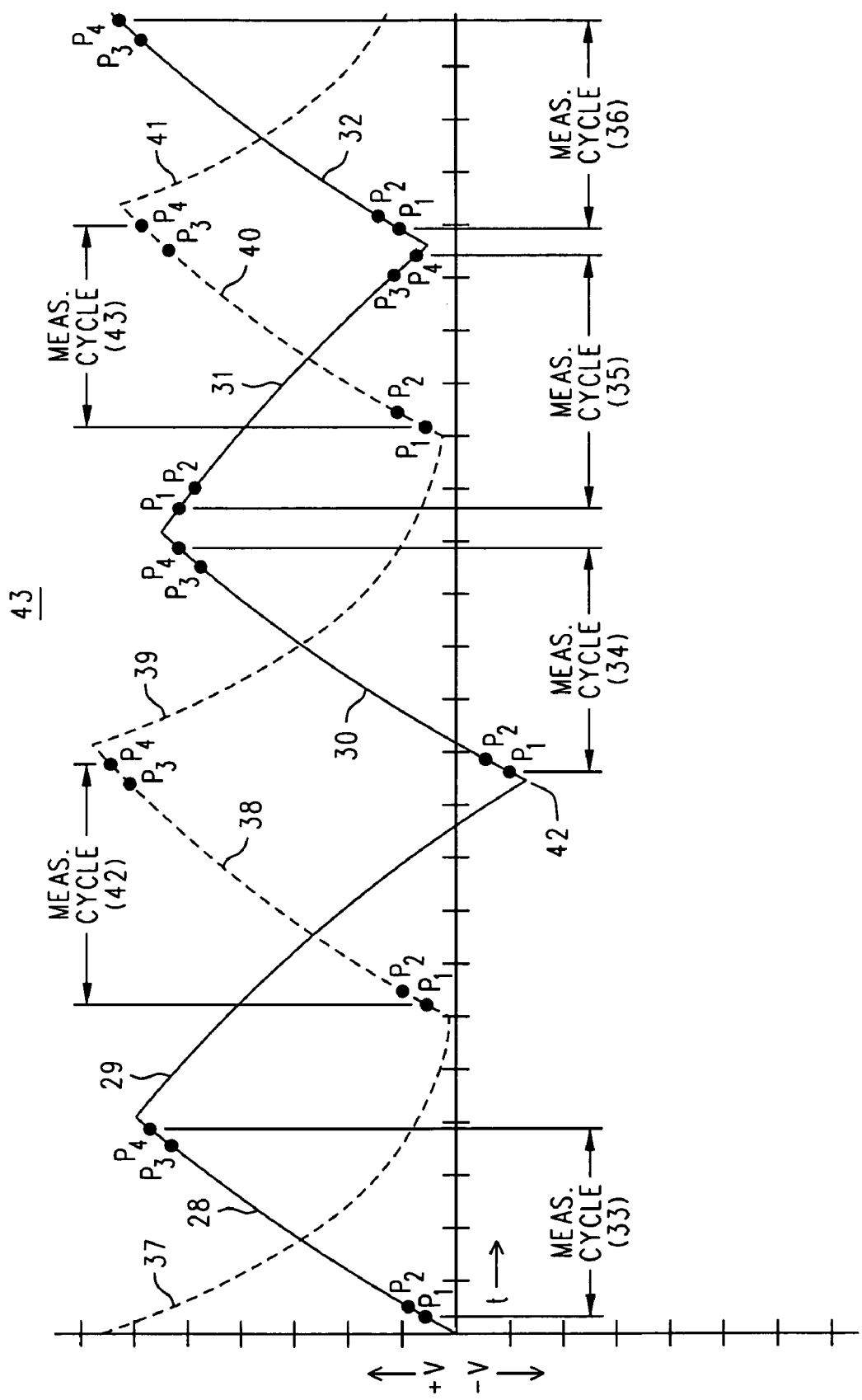
FIG. 2 is a simplified waveform diagram pertaining to charging a capacitor being measured with a constant current and useful in understanding an aspect of capacitance measurements performed in accordance with the principles of the invention.

We turn now to FIG. 2, and an explanation of how the block diagram 1 can be used to create useful waveforms across the work capacitor 2, which can then be measured to produce parameters used in computation. With reference, then, to FIG. 2, shown therein is a collection 43 of waveforms obtained by various operations performed with the block diagram of FIG. 1. Consider waveform segments 37, 38, 39, 40 and 41. These respectively represent instances of discharging, charging, discharging, charging and discharging work capacitor 2. The discharging is accomplished by setting switch 20 with CHG_DSCHG 23 to connect resistor 18 to terminal 4. Charging is accomplished by setting switch 20 to the Regulated Current Generator 17. If this mode of operation were in effect, then measurement cycles 42 and 43 could be performed (as will be described in due course) on waveform segments 38 and 40.

On the other hand, one of the more deluxe versions of FIG. 1 might be on hand, with Regulated Current Generator 19 in place of resistor 18. In that case there is not a charge/resistive-discharge paradigm, so much as a charge-up/charge-down paradigm controlled by alternations in the signal POLARITY 23. In this case each of segment 28 (charge-up, or, charge from negative to positive), segment 29 (charge-down or from positive to negative), and subsequent segments 30, 31 and 32 will support a respective measurement cycle (33, 34, 35 and 36). Note that is acceptable for a measurement cycle (34) to begin (42) with one polarity across the capacitor and end with the opposite polarity. The figure shows the measurement cycle 34 begins while the capacitor's voltage is negative, and ends with it being positive, but the example could just as well have been for the corresponding case where the measurement cycle starts with a positive voltage and ends with a negative one.

Now for what goes on to constitute a measurement cycle. A measurement cycle can be performed when the work capacitor is being charged (up or down) with a Regulated Current Generator 17 or 19. A measurement cycle is performed by taking time and voltage measurements for the locations indicated as $P_1$, $P_2$, $P_3$ and $P_4$. This is accomplished by the ADC 9 under the control of the Processing Environment 15, which operates in cahoots with the Time Base 12.

A measurement cycle made with switch 21 open measures $C_S$ and also any $R_S$, which may include any "local" $R_P$ for $C_S$. These may be stored in memory managed by the Processing Environment, so that measurement cycles subsequently made (or even previously made) with switch 21 closed (which measures $C_X$ in parallel with $C_S$) can then be corrected (by subtracting out $C_S$).

Now, to be sure, there is some steering in the algorithms performed by the Processing Environment 15 that determine how long after charging is begun to wait before taking $P_1$, how long to wait after taking $P_1$ to take $P_2$, how long to wait after $P_2$ to take $P_3$, and then, when to take $P_4$. These issues are related to what works for capacitors of different values, and possibly the outcome of an automatic range selection mechanism, which may be an initial low accuracy estimate performed under control of software executed by the Processing Environment at the start of a measurement of an unknown part. On the other hand, the operator could manually specify a range. Either way, once the range is known a particular template is selected for use in creating the waveforms 43. Such a template includes what constant current $I_C$ to use, what voltage limits to respect, as well as how long charging and discharging ought to take and thus where on the waveforms to make the measurements. Our interest in this Application is not so much as in how that housekeeping/overhead issue is managed (auto-ranging has been around for a long, long time), but rather in what subsequent computations are needed for easy discovery of $C_X$ and $R_P$, given that a reasonable set of $P_1$, $P_2$, $P_3$ and $P_4$ are provided.

TABLE I below gives some exemplary values for various measurement parameters used in the Agilent 34410A for its implementation of the measurement techniques for $C_X$ and $R_P$ set forth herein.

TABLE I

| $C_x$ Range | $I_C$ | $P_1P_2/P_3P_4$ | $P_2P_3$ | $V_{max}$ |
|---|---|---|---|---|
| .1–1 nF | .5 uA | 160 uS | 10 mS | 4 V |
| 1–10 nF | 1 uA | 300 uS | 50 mS | 4 V |
| 10–100 nF | 10 uA | 240 uS | 40 mS | 3 V |
| .1–1 uF | 100 uA | 640 uS | 100 mS | 2 V |
| 1–10 uF | 100 uA | 1 mS | 100 mS | 1 V |

We have earlier mentioned what the requirements for $P_1$, $P_2$, $P_3$ and $P_4$ are. The nature of these requirements and the reasons they exist can be better appreciated by referring to FIGS. 3 and 4.

Figure 3:
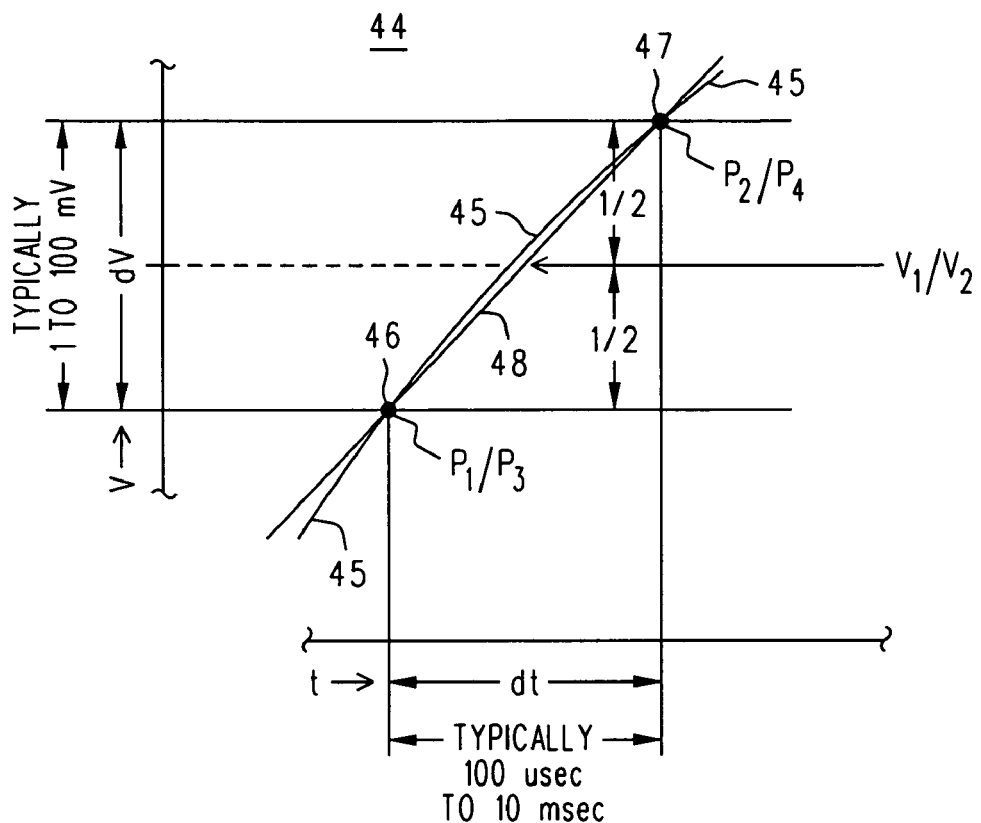
FIG. 3 is a representative enlargement of portions of the waveform of FIG. 2 where closely spaced consecutive measurements are taken.

FIG. 3 is a graph of a $P_1P_2$ or $P_3P_4$ interval. The first measured of the pair is point 46, and the second is 47. We want these two point to be "close together" in this sense: Note the straight line segment 48 that connects the two points 46 and 47. The slope of line segment 48 is an excellent approximation of the slope of the actual charging curve 45 at the midpoint thereof between point 46 and 47. This allows us to associate the slope $(dv/dt)_1$ with the voltage $V_1$ (for $P_1P_2$) and $(dv/dt)_2$ for $V_2$ at $P_3P_4$. Those items of information are input parameters to the formula we are going to evaluate to get our answers for $C_X$ and $R_P$. (Recall that $P_1=(t_A, V_A)$ and $P_2=(t_B, V_B)$, etc., so that we can substitute to reformulate dv and dt in terms of what the hardware of block diagram 1 actually measures . . . .) It can now be appreciated that the sooner $P_2$ is taken after $P_1$, and the sooner $P_4$ is taken after $P_3$, the better is the approximation for the desired slopes $(dv/dt)_1$ and $(dv/dt)_2$.

The other item of information for our formula is the time that separates the pair $P_1P_2$ from the pair $P_3P_4$. That time interval ($P_2$ to $P_3$) ought to be as long as permissible, subject to practicalities such as measurement speed and limiting the voltage rise on the work capacitor (if such a limit is desired). The graph 49 in FIG. 4 will help in appreciating why this is so.

Figure 4:
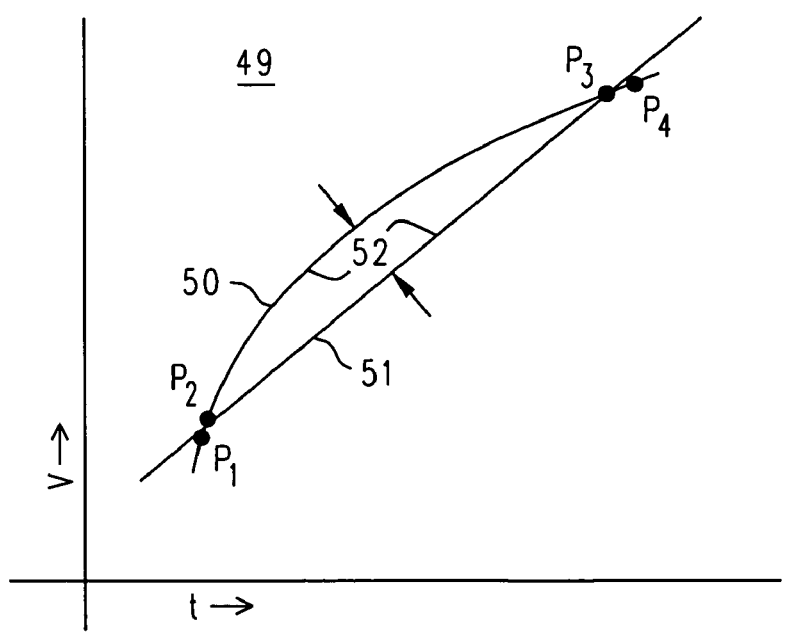
FIG. 4 is a slightly exaggerated yet representative example of an aspect of a measurement cycle of the sort performed in FIG. 2 and using a hardware arrangement of the sort shown in FIG. 1.

In FIG. 4 we see a charging curve 50 that is definitely not a straight line, such as the line segment 51 running from the $P_1P_2$ pair to the $P_3P_4$ pair. Evidently, the $C_X$ being measured in FIG. 4 has a bad case of too low a value for $R_P$! Why do we say that? Well, if $R_P$ were infinite, and there were no other resistive leakages to ground, and $I_C$ were truly constant, etc., then charging curve 52 would be a linear ramp with time, which is to say, it would be a straight line that we would expect to fall exactly onto line segment 51. As it is, however, gap 52 emerges to tell the tale, as it were. Charging curve 50 has an exponential component, and gap 52 is related to $R_P$. Now, it is not that we wish a gap 52 to be there. We place $P_3P_4$ as far after $P_1P_2$ as is practical so that if gap 52 is there we "see it" with as much resolution as we can. That is, we take note of the fact that the slope dv/dt at $P_1P_2$ is not the same as the slope dv/dt and $P_3P_4$. If we are to resolve and remove the mischief caused by $R_P$ from a measured $C_X$, then we need to resolve the difference between the two slopes. The high accuracy of the ADC helps in this regard, as does averaging. However, we can increase the resolution in the first instance by allowing enough time for the two slopes to have a greater difference. How that difference changes with time tells us about the exponential shape of charging curve 50, which in turn tells us about $R_P$.

A rigorous development of a formula that implements the finding of $C_X$ and $R_P$ using this line of reasoning and based on measuring $P_1$, $P_2$, $P_3$, and $P_4$ as described above may be found in the APPENDIX, and those who are gluttons for that sort of thing must go there for further information.

Derivation

Formulas for $C_X$ and $R_P$ can be derived as follows:

$$\tau = R_P C_X \tag{A1}$$

$$V = I_C R_P (1 - e^{-t/\tau}) \tag{A2}$$

$$\frac{dv}{dt} = \frac{I_C}{C_X}(e^{-t/\tau}) \Rightarrow e^{-t/\tau} = \frac{dv}{dt}\left(\frac{C_X}{I_C}\right) \tag{A3}$$

Substituting (A3) into (A2), $$V = I_C R_P \left[1 - \frac{dv}{dt}\left(\frac{C_X}{I_C}\right)\right] \tag{A4}$$

$$V = I_C R_P - R_P C_X \frac{dv}{dt} \tag{A5}$$

Given two points, $V_1$ and $V_2$, and the respective slopes at these points, $$\left(\frac{dv}{dt}\right)_1$$

and $$\left(\frac{dv}{dt}\right)_2,$$

$$V_1 = I_C R_P - R_P C_X \left(\frac{dv}{dt}\right)_1 \tag{A6}$$

$$V_2 = I_C R_P - R_P C_X \left(\frac{dv}{dt}\right)_2 \tag{A7}$$

Subtracting $V_1$ from $V_2$ and solving for $\tau = R_P C_X$, $$V_2 - V_1 = R_P C_X \left[\left(\frac{dv}{dt}\right)_1 - \left(\frac{dv}{dt}\right)_2\right] \tag{A8}$$

$$\tau = R_P C_X = \frac{V_2 - V_1}{\left(\frac{dv}{dt}\right)_1 - \left(\frac{dv}{dt}\right)_2} \tag{A9}$$

Substituting (A1) into (A6) and solving for $C_X$, $$V_1 = I_C R_P - R_P C_X \left(\frac{dv}{dt}\right)_1 \tag{A10}$$

$$V_1 = \frac{I_C \tau}{C_X} - \tau\left(\frac{dv}{dt}\right)_1 \Rightarrow C_X = \frac{I_C}{\left(\frac{dv}{dt}\right)_1 + \frac{V_1}{\tau}} \tag{A11}$$

Substituting (A9) into (A11) and some algebra gives $$C_X = \frac{I_C}{\left(\frac{dv}{dt}\right)_1 + \frac{V_1}{\left[\frac{V_2 - V_1}{\left(\frac{dv}{dt}\right)_1 - \left(\frac{dv}{dt}\right)_2}\right]}} \tag{A12}$$

$$C_X = \frac{I_C}{\left\{\frac{\left(\frac{dv}{dt}\right)_1 (V_2 - V_1) + V_1\left[\left(\frac{dv}{dt}\right)_1 - \left(\frac{dv}{dt}\right)_2\right]}{V_2 - V_1}\right\}} \tag{A13}$$

$$C_X = I_C \frac{V_2 - V_1}{V_2\left(\frac{dv}{dt}\right)_1 - V_1\left(\frac{dv}{dt}\right)_2} \tag{A14}$$

Subtracting the nulled value gives the equation for $C_X$ as $$C_X = I_C \frac{V_2 - V_1}{V_2\left(\frac{dv}{dt}\right)_1 - V_1\left(\frac{dv}{dt}\right)_2} - C_{offset} \tag{A15}$$

A further simplification of this formula can be attained if one assumes that $$\Delta t = t_B - t_A = t_D - t_C \tag{A16}$$

Substituting the original definitions of $V_1$, $V_2$, $$\left(\frac{dv}{dt}\right)_1,$$

and $$\left(\frac{dv}{dt}\right)_2,$$

and substituting equation (A16) into equation (A15) gives equation (A17), which may result in a simpler hardware implementation. Substitution gives the estimation for $R_P$ in equation (A18), which can be used to indicate a qualitative estimation for the quality of a capacitor.

$$C_X = \frac{I_C \Delta t}{2}\left(\frac{V_D + V_C - V_B - V_A}{V_B V_C - V_A V_D}\right) - C_{offset} \tag{A17}$$

$$R_P \cong \frac{1}{C_X} \cdot \frac{V_2 - V_1}{\left(\frac{dv}{dt}\right)_1 - \left(\frac{dv}{dt}\right)_2} \tag{A18}$$

A quality measure, k, can be defined as:

$$k = I_C R_P \quad (A19)$$

Since the DMM will have its own k for its own offset capacitance, this calculation needs to be altered as follows.

$$\text{Let } k_{offset}C_{offset} + k_{effective}C_{effective} = k_{measured}C_{measured} \quad (A20)$$

Substituting $C_{measured} = C_{effective} + C_{offset}$ and after some algebra, $$k_{effective} = k_{measured} + \frac{C_{offset}}{C_{effective}}(k_{measured} - k_{offset}) \quad (A21)$$

where $k_{offset}$ is roughly 500. For typical capacitors, the following qualitative rules may apply as a general quality measure:

| | |
|---|---|
| $k_{effective} > 750$ | quality is HIGH |
| $k_{effective} < 250$ | quality is LOW |
| otherwise | quality is MODERATE |

I claim:

1. A method of measuring the capacitance $C_X$ of a work capacitor in the presence of a parallel resistance $R_P$, the method comprising the steps of:
   (a) charging the work capacitor for a selected interval of time with a constant current $I_C$ having a selected value;
   (b) approximating a first slope $(dv/dt)_1$ of the voltage waveform across the work capacitor at a first time near but after the start of the selected time interval;
   (c) finding the voltage $V_1$ across the work capacitor at the first time;
   (d) approximating a second slope $(dv/dt)_2$ of the voltage waveform across the work capacitor at a second time near but before the end of the selected time interval;
   (e) finding the voltage $V_2$ across the work capacitor at the second time;
   (f) computing a value of $C_X$ as a function of $I_C$, $(dv/dt)_1$, $(dv/dt)_2$, $V_1$ and $V_2$; and
   (h) outputting said value of $C_X$ computed in step (f).

2. A method as in claim 1 further comprising, subsequent to steps (a)–(f), the step of diminishing $C_X$ by a previously measured value of a stray capacitance present in the absence of the work capacitor.

3. A method of measuring the capacitance $C_X$ of a work capacitor in the presence of a parallel resistance $R_P$, the method comprising the steps of:
   (a) charging the work capacitor for a first selected interval of time with a constant current $I_C$ having a selected value;
   (b) approximating a first slope $(dv/dt)_1$ of the voltage waveform across the work capacitor at a first time near but after the start of the first selected time interval;
   (c) finding the voltage $V_1$ across the work capacitor at the first time;
   (d) approximating a second slope $(dv/dt)_2$ of the voltage waveform across the work capacitor at a second time near but before the end of the first selected time interval;
   (e) finding the voltage $V_2$ across the work capacitor at the second time;
   (f) finding a first difference $V_2-V_1$;
   (g) finding a second difference $(dv/dt)_1 V_2 - (dv/dt)_2 V_1$;
   (h) finding a first quotient by dividing the first difference by the second difference;
   (i) finding a first value of $C_X$ as the product of $I_C$ and the first quotient; and
   (j) outputting the first value of $C_X$ found in step (i).

4. A method as in claim 3 further comprising the subsequent steps of:
   (j) charging the work capacitor for a selected interval of time with a constant current $-I_C$ having a selected value;
   (k) approximating a third slope $(dv/dt)_3$ of the voltage waveform across the work capacitor at a third time near but after the start of the second selected time interval;
   (l) finding the voltage $V_3$ across the work capacitor at the third time;
   (m) approximating a fourth slope $(dv/dt)_4$ of the voltage waveform across the work capacitor at a fourth time near but before the end of the second selected time interval;
   (n) finding the voltage $V_4$ across the work capacitor at the fourth time;
   (o) finding a third difference $V_4-V_3$;
   (p) finding a fourth difference $(dv/dt)_3 V_4 - (dv/dt)_4 V_3$;
   (q) finding a second quotient by dividing the third difference by the fourth difference;
   (r) finding a second value of $C_X$ as the product of $-I_C$ and the second quotient; and
   (s) finding the average of the first and second values of $C_X$.

5. A method as in claim 3 further comprising the step of determining the value for $I_C$ and the length of the first selected time interval based upon a previously performed trial measurement of $C_X$.

6. A method as in claim 3 further comprising the step of determining the value for $I_C$ and the length of the first selected time interval based upon a previously performed trial measurement of $C_X$ and a selected maximum voltage that the work capacitor is to experience.

7. A method as in claim 3 further comprising the step (j) of, subsequent to steps (a)–(i), of discharging the work capacitor through a resistance.

8. A method as in claim 7 further comprising, subsequent to step (j), the step of repeating steps (a)–(i).

9. A method as in claim 3 wherein the work capacitance for steps (a)–(i) is a stray capacitance, and further comprising the subsequent step (j) of connecting an actual work capacitance, and then repeating steps (a)–(i) with the actual work capacitance in parallel with the stray capacitance, and finally diminishing the value of $C_X$ found for the actual work capacitance by the value of $C_X$ found for the stray capacitance.

* * * * *